(12) United States Patent
Huang et al.

(10) Patent No.: US 11,257,756 B1
(45) Date of Patent: Feb. 22, 2022

(54) ANTIFUSE STRUCTURE

(71) Applicant: NANYA TECHNOLOGY CORPORATION, New Taipei (TW)

(72) Inventors: Chin-Ling Huang, Taoyuan (TW);
Yu-Fang Chen, New Taipei (TW);
Chun-Hsien Lin, New Taipei (TW);
Chia-Ping Liao, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/995,842

(22) Filed: Aug. 18, 2020

(51) Int. Cl.
*H01L 29/04* (2006.01)
*H01L 21/44* (2006.01)
*H01L 23/525* (2006.01)
*H01L 27/112* (2006.01)

(52) U.S. Cl.
CPC .... *H01L 23/5252* (2013.01); *H01L 27/11206* (2013.01)

(58) Field of Classification Search
CPC ... H01L 23/525–5258; H01L 27/11206; H01L 2924/1453

USPC .................. 257/50, 355, 740; 438/598–601
See application file for complete search history.

(56) References Cited

U.S. PATENT DOCUMENTS

| | | | |
|---|---|---|---|
| 9,123,572 B2 * | 9/2015 | Kurjanowicz | G11C 17/16 |
| 9,209,194 B1 * | 12/2015 | Ikeda | H01L 27/10897 |
| 10,777,288 B2 * | 9/2020 | Kurjanowicz | H01L 27/0203 |
| 2020/0020705 A1 | 1/2020 | Huang et al. | |

FOREIGN PATENT DOCUMENTS

| TW | I680566 B | 12/2019 |
|---|---|---|
| TW | 202006932 A | 2/2020 |

* cited by examiner

*Primary Examiner* — Calvin Lee
(74) *Attorney, Agent, or Firm* — CKC & Partners Co., LLC

(57) ABSTRACT

An antifuse structure includes an active area, a gate electrode and a dielectric layer. The gate electrode is over the active area, in which the gate electrode is ring-shaped, and a portion of the gate electrode is overlapped with a portion of the active area in a vertical projection direction, and the portion of the active area has a dopant concentration higher than a dopant concentration of another portion of the active area. The dielectric layer is sandwiched between the portion of the active area and the portion of the gate electrode.

11 Claims, 2 Drawing Sheets

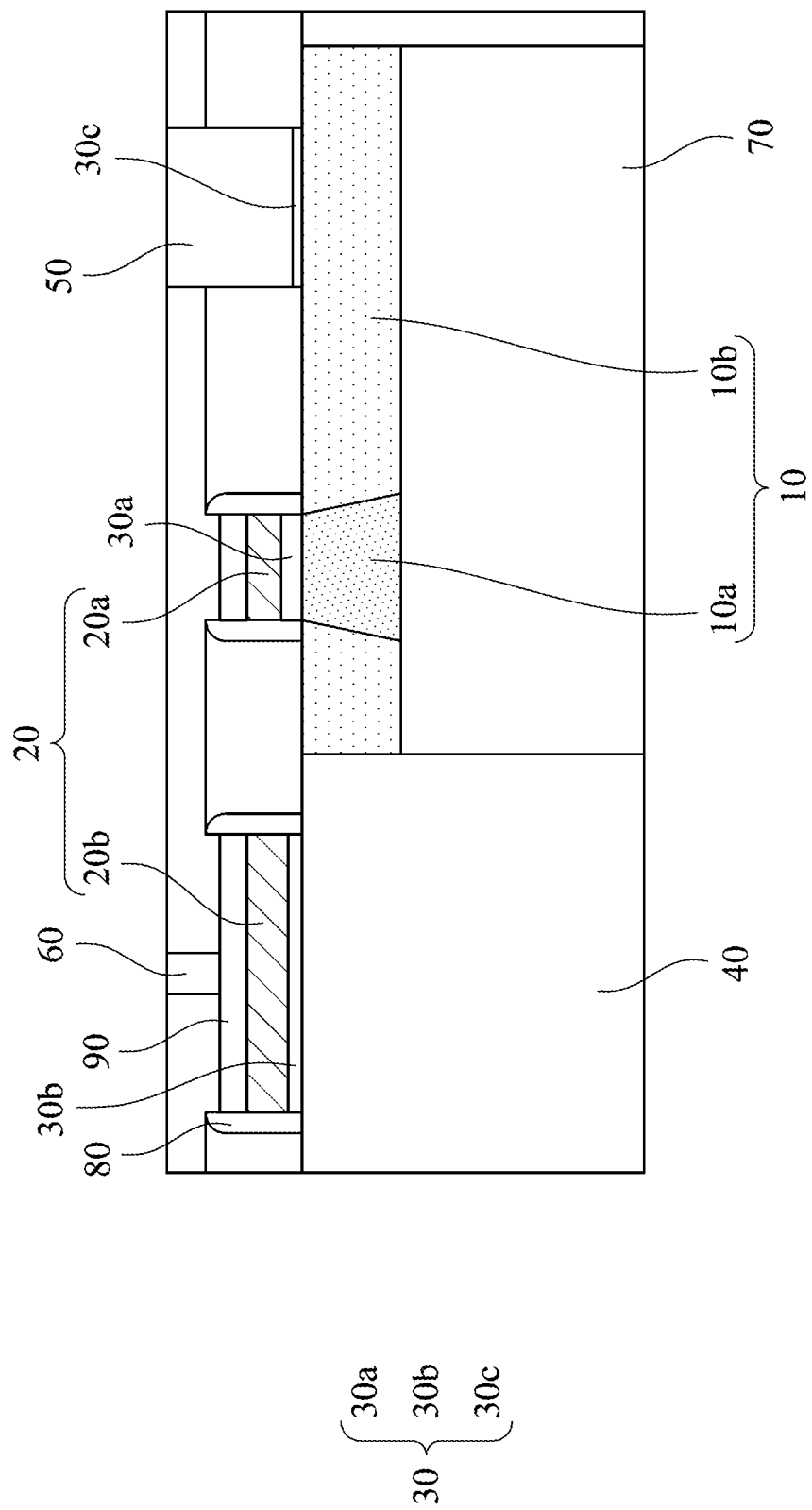

ANTIFUSE STRUCTURE

BACKGROUND

Field of Invention

The present invention relates to an antifuse structure.

Description of Related Art

In integration circuit fabrication, the antifuse and the fuse are widely used for fault tolerance. For example, the antifuse and the fuse may be placed in circuit paths in a device. An originally conductible circuit path may become an open circuit by blowing a fuse. In contrast, an originally unconductible circuit path may become a short circuit by blowing an antifuse. In addition, the antifuse is also used for one-time programming.

One type of the antifuse structure is comprised of two conductors separated from each other by an insulator. The two conductors are separately connected to different components. The path between the two conductors is an unconductible circuit path, i.e., an open circuit, when the applied voltage is lower than a programming voltage. When the programming voltage is applied, the insulator undergoes a dielectric breakdown process. A leakage current increases and a thermal runaway condition develops, melting the insulator and adjacent conductive materials. The conductive materials flow from the two conductors and form a conductive filament, resulting in a short circuit between the two conductors.

However, how to increase the conductive properties of the antifuse structure is an issue that needs to be improved in the art.

SUMMARY

The present invention provides an antifuse structure, which includes an active area, a gate electrode and a dielectric layer. The gate electrode is over the active area, in which the gate electrode is ring-shaped, and a portion of the gate electrode is overlapped with a portion of the active area in a vertical projection direction, and the portion of the active area has a dopant concentration higher than a dopant concentration of another portion of the active area. The dielectric layer is sandwiched between the portion of the active area and the portion of the gate electrode.

According to some embodiments of the present invention, the antifuse structure further includes an isolation structure surrounds the active area.

According to some embodiments of the present invention, the gate electrode has an opening exposing a portion of the isolation structure.

According to some embodiments of the present invention, the antifuse structure further includes an isolation structure beneath another portion of the gate electrode.

According to some embodiments of the present invention, the dielectric layer is further sandwiched between the isolation structure and the other portion of the gate electrode.

According to some embodiments of the present invention, the dielectric layer sandwiched between the portion of the active area and the portion of the gate electrode has a thickness greater than a thickness of the dielectric layer sandwiched between the isolation structure and the other portion of the gate electrode.

According to some embodiments of the present invention, the antifuse structure further includes a first conductive via over the other portion of the active area.

According to some embodiments of the present invention, the dielectric layer is further sandwiched between the other portion of the active area and the first conductive via.

According to some embodiments of the present invention, the dielectric layer sandwiched between the portion of the active area and the portion of the gate electrode has a thickness greater than a thickness of the dielectric layer sandwiched between the other portion of the active area and the first conductive via.

According to some embodiments of the present invention, the antifuse structure further includes a second conductive via electrically connected to the gate electrode.

According to some embodiments of the present invention, the second conductive via is over another portion of the gate electrode.

According to some embodiments of the present invention, the second conductive via has an extending direction different from an extending direction of the first conductive via.

According to some embodiments of the present invention, the antifuse structure further includes a doped well region beneath the active area.

According to some embodiments of the present invention, the doped well region is substantially aligned with the active area and has a dopant with a conductive type different from a conductive type of a dopant of the active area.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 2 is a schematic cross-sectional view illustrating an antifuse structure along a line A-A' of FIG. 1A in accordance with some embodiments of the present disclosure.

DETAILED DESCRIPTION

Figure 1:
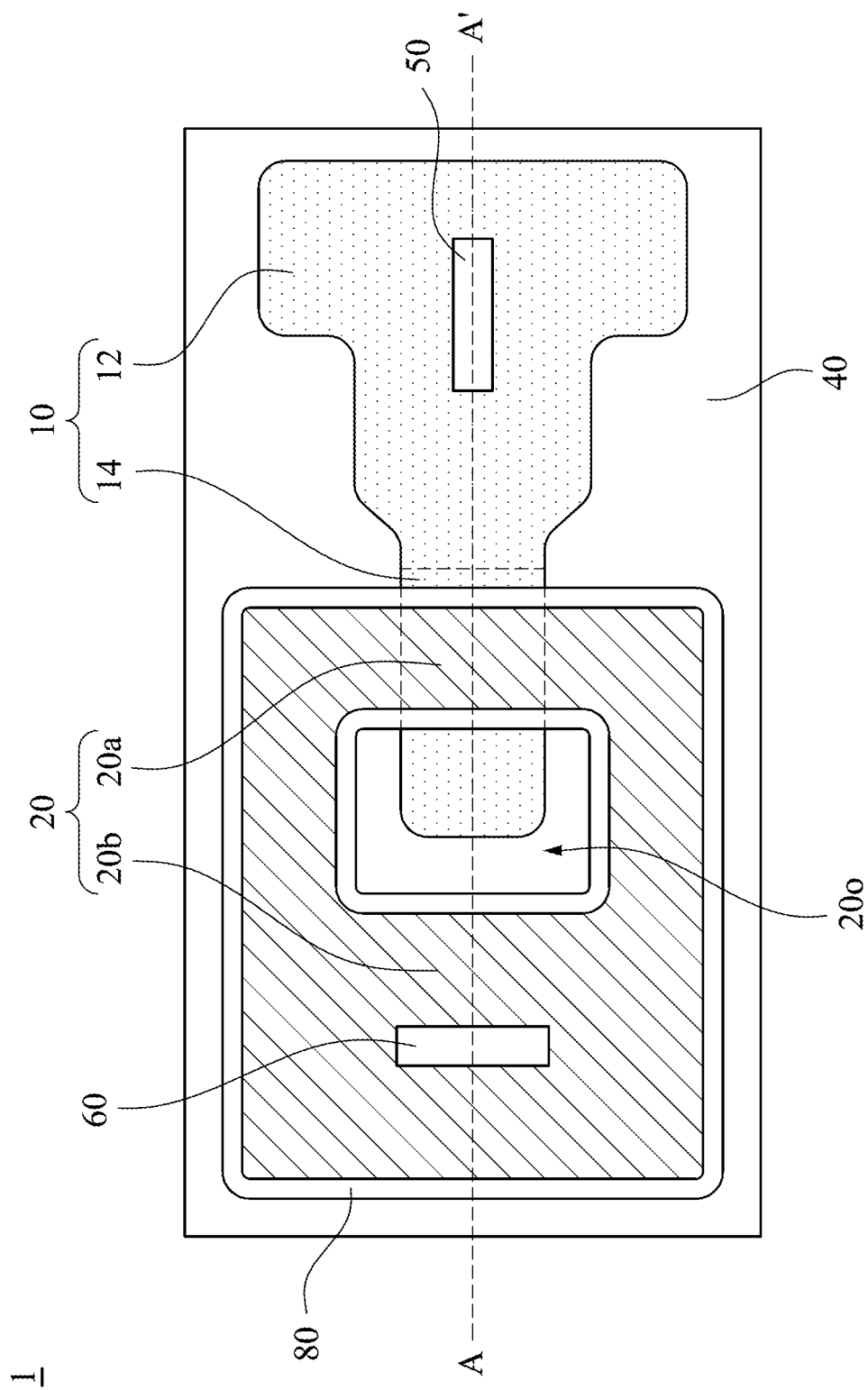
FIG. 1 is a schematic top view illustrating an antifuse structure in accordance with some embodiments of the present disclosure.

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. In the following description, numerous specific details will be described in detail in order to enable the reader to fully understand the following embodiments. However, the embodiments of the present disclosure may be practiced without these specific details.

Further, spatially relative terms, such as "beneath," "over," and the like, may be used herein for ease of description to describe one element or feature's relationship to another element(s) or feature(s) as shown in the figures. The true meaning of the spatially relative terms includes other orientations. For example, when the figure is flipped up and down by 180 degrees, the relationship between one component and another component may change from "beneath" to "over." In addition, the spatially relative descriptions used herein should be interpreted the same.

As mentioned in the related art, how to increase the conductive properties of the antifuse structure is an issue that needs to be improved in the art. Therefore, the present disclosure provides an antifuse structure, in which the gate electrode is ring-shaped, and a portion of the active area overlapped with a portion of the gate electrode has a dopant concentration higher than a dopant concentration of another portion of the active area, so that the antifuse structure has better conductive properties. Embodiments of the antifuse structure will be described in detail below.

FIG. 1 is a schematic top view illustrating an antifuse structure in accordance with some embodiments of the present disclosure. FIG. 2 is a schematic cross-sectional view illustrating an antifuse structure along a line A-A' of FIG. 1 in accordance with some embodiments of the present disclosure. As shown in FIGS. 1 and 2, the antifuse structure 1 includes an active area 10 and a gate electrode 20 disposed over the active area 10.

In some embodiments, the active area 10 includes semiconductor and dopants. In some embodiments, the active area 10 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof.

In some embodiments, the active area 10 includes an n-type dopant, such as phosphorus (P), arsenic (As), antimony (Sb), bismuth (Bi), selenium (Se), tellurium (Te), another suitable n-type dopants or a combination thereof. In some embodiments, the active area 10 includes a p-type dopant, such as boron, boron difluoride, or another suitable p-type dopants or a combination thereof.

As shown in FIGS. 1 and 2, the active area 10 includes a portion 10a overlapped with a portion 20a of the gate electrode 20 in a vertical projection direction and another portion 10b outside the portion 10a, and the portion 10a has a dopant concentration higher than a dopant concentration of the other portion 10b of the active area 10. Therefore, the portion 10a may be called as a "highly doped region", and the other portion 10b may be called as a "lightly doped region."

In some embodiments, in a top view, the active area 10 is T-shaped (as shown in FIG. 1) or other shaped, such as L-shaped, but not limited thereto. In some embodiments, as shown in FIG. 1, the active area 10 includes a body portion 12 and an extending portion 14 connecting the body portion 12, and the extending portion 14 extends toward the gate electrode 20. In some embodiments, the body portion 12 is opposite to the gate electrode 20. In some embodiments, the body portion 12 is far away from the gate electrode 20 compared with the extending portion 14. In some embodiments, the body portion 12 has a width greater than a width of the extending portion 14 in a top view, but not limited thereto.

As shown in FIGS. 1 and 2, the gate electrode 20 is disposed over the active area 10. In some embodiments, the gate electrode 20 includes a doped semiconductor material such as doped polycrystalline silicon or a metal-containing material such as titanium (Ti), tantalum (Ta), tungsten (W), aluminum (Al), zirconium (Zr), hafnium (Hf), titanium aluminum (TiAl), tantalum aluminum (TaAl), tungsten aluminum (WAl), zirconium aluminum (ZrAl), hafnium aluminum (HfAl), titanium nitride (TiN), tantalum nitride (TaN), titanium silicon nitride (TiSiN), tantalum silicon nitride (TaSiN), tungsten silicon nitride (WSiN), titanium carbide (TiC), tantalum carbide (TaC), titanium aluminum carbide (TiAlC), tantalum aluminum carbide (TaAlC), titanium aluminum nitride (TiAlN), tantalum aluminum nitride (TaAlN), any other suitable metal-containing material or a combination thereof. In some embodiments, the gate electrode 20 includes the doped semiconductor material, and the active area 10 and the gate electrode 20 have the same dopant type.

As shown in FIG. 1, in a top view, the gate electrode 20 is ring-shaped and has an opening 20o. For example, the shape of the gate electrode 20 is circular ring-shaped, oval ring-shaped, square ring-shaped, rectangular ring-shaped (as shown in FIG. 1), but not limited thereto. In some embodiments, the extending portion 14 of the active area 10 extends toward the opening 20o of the gate electrode 20. In some embodiments, as shown in FIGS. 1 and 2, the gate electrode 20 includes the portion 20a overlapped with the portion 10a of the active area 10 in the vertical projection direction and another portion 20b outside the portion 20a. In some embodiments, the other portion 20b of the gate electrode 20 is C-shaped (as shown in FIG. 1) or other shaped, such as U-shaped, but not limited thereto.

As shown in FIG. 2, a dielectric layer 30a, 30 is sandwiched between the portion 10a of the active area 10 and the portion 20a of the gate electrode 20. In some embodiments, the dielectric layer 30 includes silicon nitride, silicon oxide, silicon oxynitride, any other suitable material or a combination thereof. In some embodiments, the dielectric layer 30 is made of oxide and may be called as a "gate oxide." In some embodiments, the dielectric layer 30 may be single-layered or multi-layered.

In some embodiments, as shown in FIG. 1, the antifuse structure 1 further includes an isolation structure 40 surrounds the active area 10. In some embodiments, the opening 20o of the gate electrode 20 exposes a portion of the isolation structure 40. In some embodiments, the opening 20o of the gate electrode 20 exposes a portion of the extending portion 14 of the active area 10, but not limited thereto.

In some embodiments, as shown in FIGS. 1 and 2, the isolation structure 40 is disposed beneath the other portion 20b of the gate electrode 20. In some embodiments, the dielectric layer 30b, 30 is further sandwiched between the isolation structure 40 and the other portion 20b of the gate electrode 20. In some embodiments, the dielectric layer 30a, 30 sandwiched between the portion 10a of the active area 10 and the portion 20a of the gate electrode 20 has a thickness greater than a thickness of the dielectric layer 30b, 30 sandwiched between the isolation structure 40 and the other portion 20b of the gate electrode 20.

In some embodiments, as shown in FIGS. 1 and 2, the antifuse structure 1 further includes a first conductive via 50 disposed over the other portion 10b of the active area 10. In some embodiments, as shown in FIG. 1, the first conductive via 50 is disposed over the body portion 12 of the active area 10, but not limited thereto.

In some embodiments, as shown in FIG. 2, the dielectric layer 30c, 30 is further sandwiched between the other portion 10b of the active area 10 and the first conductive via 50. In some embodiments, as shown in FIGS. 1 and 2, the dielectric layer 30c, 30 is further sandwiched between the body portion 12 of the active area 10 and the first conductive via 50. In some embodiments, the dielectric layer 30a, 30 sandwiched between the portion 10a of the active area 10 and the portion 20a of the gate electrode 20 has a thickness greater than a thickness of the dielectric layer 30c, 30 sandwiched between the other portion 10b of the active area 10 and the first conductive via 50. In some embodiments, a thickness of the dielectric layer 30b, 30 is s greater than a thickness of the dielectric layer 30c, 30.

In some embodiments, as shown in FIGS. 1 and 2, the antifuse structure 1 further includes a second conductive via 60 electrically connected to the gate electrode 20. In some embodiments, the second conductive via 60 is disposed over the other portion 20b of the gate electrode 20. In some embodiments, as shown in FIG. 1, the second conductive via 60 is disposed over a portion of the other portion 20b of the gate electrode 20 opposite to the portion 20a of the gate electrode 20, but not limited thereto. In some embodiments, the portion of the other portion 20b of the gate electrode 20 is far away from the portion 20a of the gate electrode 20.

In some embodiments, as shown in FIG. 1, the second conductive via 60 has an extending direction different from an extending direction of the first conductive via 50, but not limited thereto.

In some embodiments, as shown in FIG. 2, the antifuse structure 1 further includes a doped well region 70 beneath the active area 10. In some embodiments, the doped well region 70 is substantially aligned with the active area 10 and has a dopant with a conductive type different from a conductive type of the dopant of the active area 10.

In some embodiments, as shown in FIGS. 1 and 2, the antifuse structure 1 further includes a spacer 80 adjacent to sidewalls of the gate electrode 20. In some embodiments, the spacer 80 is in contact with the sidewalls of the gate electrode 20. In some embodiments, the spacer 80 includes silicon nitride, silicon oxide, silicon oxynitride, silicon carbon nitride, any other suitable material or a combination thereof. In some embodiments, the spacer 80 may be single-layered or multi-layered.

In some embodiments, as shown in FIG. 2, the antifuse structure 1 may further include a contact 90 sandwiched between the gate electrode 20 and the second conductive via 60. In some embodiments the contact 90 includes a metal-containing material, such as Ti, Ta, W, Al, Zr, Hf, TiAl, TaAl, WAl, ZrAl, HfAl, TiN, TaN, TiSiN, TaSiN, WSiN, TiC, TaC, TiAlC, TaAlC, TiAlN, TaAlN, any other suitable metal-containing material or a combination thereof.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An antifuse structure, comprising:
   an active area;
   a gate electrode over the active area, wherein the gate electrode is ring-shaped, and a portion of the gate electrode is overlapped with a portion of the active area in a vertical projection direction, and the portion of the active area has a dopant concentration higher than a dopant concentration of another portion of the active area;
   a dielectric layer sandwiched between the portion of the active area and the portion of the gate electrode;
   a first conductive via over the other portion of the active area; and
   a second conductive via electrically connected to the gate electrode, wherein the second conductive via has an extending direction different from an extending direction of the first conductive via.

2. The antifuse structure of claim 1, wherein the second conductive via is over another portion of the gate electrode.

3. The antifuse structure of claim 1, wherein the dielectric layer is further sandwiched between the other portion of the active area and the first conductive via.

4. The antifuse structure of claim 3, wherein the dielectric layer sandwiched between the portion of the active area and the portion of the gate electrode has a thickness greater than a thickness of the dielectric layer sandwiched between the other portion of the active area and the first conductive via.

5. The antifuse structure of claim 1, further comprising an isolation structure surrounds the active area.

6. The antifuse structure of claim 5, wherein the gate electrode has an opening exposing a portion of the isolation structure.

7. The antifuse structure of claim 1, further comprising a doped well region beneath the active area.

8. The antifuse structure of claim 7, wherein the doped well region is substantially aligned with the active area and has a dopant with a conductive type different from a conductive type of a dopant of the active area.

9. The antifuse structure of claim 1, further comprising an isolation structure beneath another portion of the gate electrode.

10. The antifuse structure of claim 9, wherein the dielectric layer is further sandwiched between the isolation structure and the other portion of the gate electrode.

11. The antifuse structure of claim 10, wherein the dielectric layer sandwiched between the portion of the active area and the portion of the gate electrode has a thickness greater than a thickness of the dielectric layer sandwiched between the isolation structure and the other portion of the gate electrode.

* * * * *